United States Patent
Han et al.

(10) Patent No.: US 11,343,926 B2
(45) Date of Patent: May 24, 2022

(54) FLEXIBLE DISPLAY DEVICE AND TERMINAL

(71) Applicant: WUHAN CHINA STAR OPTOELECTRONICS SEMICONDUCTOR DISPLAY TECHNOLOGY CO., LTD., Hubei (CN)

(72) Inventors: Wen Han, Hubei (CN); Zhuo Zhang, Hubei (CN); Fang Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 210 days.

(21) Appl. No.: 16/621,403

(22) PCT Filed: Oct. 15, 2019

(86) PCT No.: PCT/CN2019/111227
§ 371 (c)(1),
(2) Date: Dec. 11, 2019

(87) PCT Pub. No.: WO2020/215624
PCT Pub. Date: Oct. 29, 2020

(65) Prior Publication Data
US 2021/0337683 A1    Oct. 28, 2021

(30) Foreign Application Priority Data

Apr. 26, 2019 (CN) .......................... 201910342907.9

(51) Int. Cl.
H05K 7/02 (2006.01)
H05K 7/04 (2006.01)
H05K 5/02 (2006.01)

(52) U.S. Cl.
CPC ................................. *H05K 5/0217* (2013.01)

(58) Field of Classification Search
USPC .......................................... 361/807, 809, 810
See application file for complete search history.

(56) References Cited

U.S. PATENT DOCUMENTS

| 4,300,471 A * | 11/1981 | Desjardins | B44C 7/04 118/235 |
| D815,611 S * | 4/2018 | Shin | D14/129 |
| D821,347 S * | 6/2018 | Shin | D14/138 R |
| 2015/0340004 A1* | 11/2015 | Pang | G06F 1/1652 345/205 |

(Continued)

*Primary Examiner* — Hung S. Bui

(57) ABSTRACT

The present invention provides a flexible display device and a terminal, the flexible display device includes a casing, a roller assembly, a supporting layer, and a flexible display screen. An accommodating cavity is defined in the casing. An opening is defined in a side surface. The roller assembly is disposed in the accommodating cavity and comprises a first roller, a second roller, and a connecting member. Wrapping directions of the supporting layer on the first roller and the second roller are opposite. The flexible display screen is disposed on the supporting layer. The present invention reduces a risk of damage of the flexible display screen due to the stress.

19 Claims, 13 Drawing Sheets

(56) References Cited

U.S. PATENT DOCUMENTS

| | | | |
|---|---|---|---|
| 2016/0120023 A1* | 4/2016 | Choi | G02F 1/133305 |
| | | | 361/749 |
| 2016/0209879 A1* | 7/2016 | Ryu | G06F 1/1601 |
| 2016/0324021 A1* | 11/2016 | Takayanagi | G06F 1/1652 |
| 2017/0336831 A1* | 11/2017 | Zhang | G06F 3/0412 |
| 2018/0103551 A1* | 4/2018 | Park | F16H 1/20 |

* cited by examiner

FLEXIBLE DISPLAY DEVICE AND TERMINAL

FIELD OF INVENTION

The present invention relates to a field of display technologies, especially to a flexible display device and a terminal.

BACKGROUND OF INVENTION

A flexible display device has the advantage of good bending resistance and is more and more popular in the market.

A conventional flexible display device uses a single reel to receive a flexible display screen. Once a bending radius thereof is smaller than a diameter of the reel, the flexible display screen is easily damaged due to an excessive partial stress.

Therefore, the technical issue of the conventional flexible display device that the flexible display screen is easily damaged when curling needs to be solved.

SUMMARY OF INVENTION

The present invention provides a flexible display device and a terminal to mitigate that a flexible display screen in a conventional flexible display device is easily damaged when curling.

To solve the above issue, the present invention provides technical solutions as follows.

The present invention provides a flexible display device comprising:

a casing, the casing being cylindrical, an accommodating cavity defined in the casing, and an opening defined in a side surface of the casing;

a roller assembly disposed in the accommodating cavity, comprising a first roller, a second roller, and a connecting member connecting the first roller and the second roller, and axial lines of the first roller and the second roller parallel an axial line of the casing;

a supporting layer wrapped around the first roller and the second roller, a wrapping direction of the supporting layer on the first roller being counter to a wrapping direction of the supporting layer on the second roller, and the supporting layer extending out of the casing through the opening; and a flexible display screen disposed on the supporting layer.

In the flexible display device of the present invention, a dimension of the first roller is equal to a dimension of the second roller.

In the flexible display device of the present invention, the flexible display device further comprises a protective member, the protective member is connected to an end of the supporting layer, and a dimension of the protective member is greater than a dimension of the opening.

In the flexible display device of the present invention, the opening comprises a first opening and a second opening, a first end of the supporting layer extends out of the casing through the first opening, and a second end of the supporting layer extends out of the casing through the second opening.

In the flexible display device of the present invention, a connection line between the first opening and the second opening coincides with a diameter of the casing.

In the flexible display device of the present invention, the flexible display device further comprises a first protective member and a second protective member, the first protective member is connected to the first end, the second protective member is connected to the second end, a dimension of the first protective member is greater than a dimension of the first opening, and a dimension of the second protective member is greater than a dimension of the second opening.

In the flexible display device of the present invention, a mark is disposed on the flexible display device, and the mark is configured to mark up a middle position of the supporting layer.

In the flexible display device of the present invention, the mark is disposed on the flexible display screen.

In the flexible display device of the present invention, the mark is disposed on the supporting layer.

In the flexible display device of the present invention, the display device further comprises an adhesive layer, the adhesive layer is disposed between the supporting layer and the flexible display screen, and the flexible display screen is fixed on the supporting layer by the adhesive layer.

In the flexible display device of the present invention, material of the adhesive layer is made of optical clear adhesive.

In the flexible display device of the present invention, a thickness of the supporting layer ranges from 20 to 30 microns.

In the flexible display device of the present invention, material of the supporting layer is made of stainless steel.

In the flexible display device of the present invention, an area of the flexible display screen is less than or equal to an area of the supporting layer.

In the flexible display device of the present invention, the first roller and the second roller are outer gears, the casing is an inner gear, and the outer gears engage the inner gear.

In the flexible display device of the present invention, the flexible display device further comprises a drive member, the drive member drives the roller assembly to rotate to retract the supporting layer back into the casing.

The present invention also provides a terminal comprising a flexible display device, and the flexible display device comprises:

a casing, the casing being cylindrical, an accommodating cavity defined in the casing, and an opening defined in a side surface of the casing;

a roller assembly disposed in the accommodating cavity, comprising a first roller, a second roller, and a connecting member connecting the first roller and the second roller, and axial lines of the first roller and the second roller parallel an axial line of the casing;

a supporting layer wrapped around the first roller and the second roller, a wrapping direction of the supporting layer on the first roller being counter to a wrapping direction of the supporting layer on the second roller, and the supporting layer extending out of the casing through the opening; and a flexible display screen disposed on the supporting layer.

In the terminal of the present invention, a dimension of the first roller is equal to a dimension of the second roller.

In the terminal of the present invention, the flexible display device further comprises a protective member, the protective member is connected to an end of the supporting layer, and a dimension of the protective member is greater than a dimension of the opening.

In the terminal of the present invention, the opening comprises a first opening and a second opening, a first end of the supporting layer extends out of the casing through the first opening, and a second end of the supporting layer extends out of the casing through the second opening.

Advantages of the present invention are as follows. The present invention provides a flexible display device and a terminal, and the flexible display device comprises a casing, a roller assembly, a supporting layer, and a flexible display screen, the casing being cylindrical, an accommodating cavity defined in the casing, an opening defined in a side surface of the casing; the roller assembly disposed in the accommodating cavity and comprising a first roller, a second roller, and a connecting member connected to the first roller and the second roller, an axial line of the first roller and an axial line of the second roller paralleling an axial line of the casing; the supporting layer wrapped around the first roller and the second roller, and a wrapping direction on the first roller is counter to a wrapping direction on the second roller, and the supporting layer extending out of the casing through the opening; and the flexible display screen disposed on the supporting layer. Because of using a design of dual roller rotation, the flexible display screen can be opened or retracted in a shorter time. The wrapping directions of the flexible display screen on the first roller and the second roller are opposite such that stresses cancel each other out, which reduces a risk of damage of the flexible display screen due to the stress. At the meantime, disposing the supporting layer, and the stress is exerted on the supporting layer and further mitigates a risk of rupture of the forced flexible display screen the flexible display screen is almost not forced when pulled back into or extending out of the casing, the stress is exerted on the supporting layer and further mitigates a risk of rupture of the forced flexible display screen.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
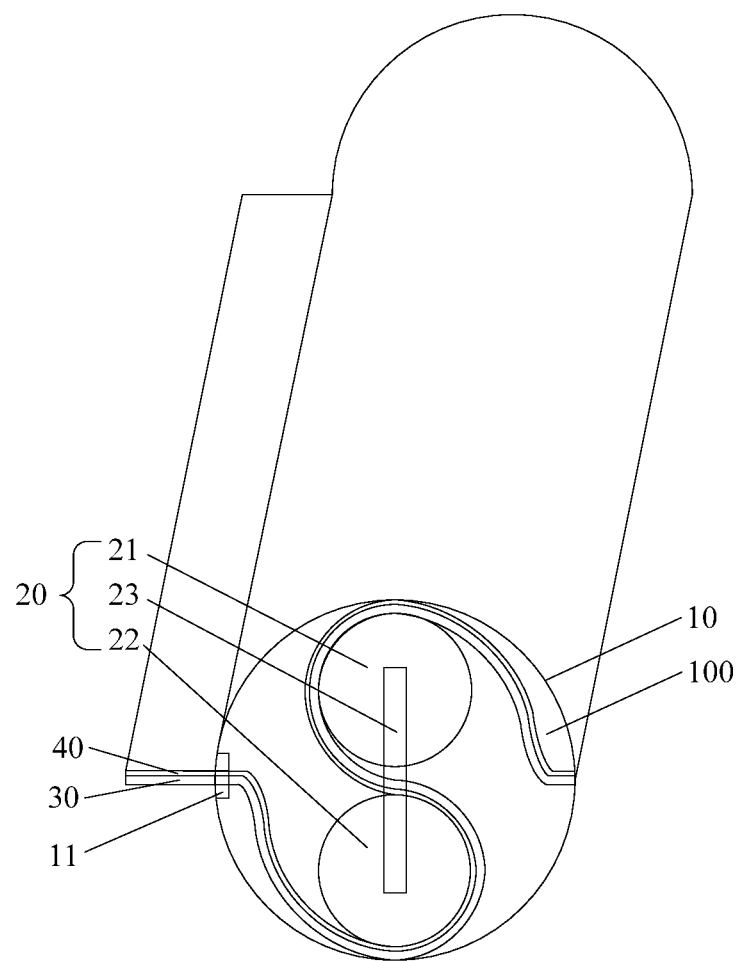
FIG. 1 is a schematic view of a first structure of a flexible display device provided by an embodiment of the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

The present invention provides a flexible display device and a terminal to mitigate a technical issue of easy damage of a curling flexible display screen in a conventional flexible display device.

With reference to FIG. 1, FIG. 1 is a schematic view of a first structure of a flexible display device provided by an embodiment of the present invention. flexible display device comprises a casing 10, a roller assembly 20, a supporting layer 30, and a flexible display screen 40.

The casing 10 is cylindrical, and an accommodating cavity 100 is defined therein. An opening 11 is defined in a side surface of the casing 10, and a number of the opening 11 can be one or two. In the present embodiment, the number of the opening 11 is one.

The roller assembly 20 is disposed in the accommodating cavity 100, and comprises a first roller 21, a second roller 22, and a connecting member 23 connected to the first roller 21 and the second roller 22. An axial line of the first roller 21 and an axial line of the second roller 22 parallel an axial line of the casing 10.

In the present embodiment, both the first roller 21 and the second roller 22 are cylinders, and a side surface of each cylinder is a smooth surface. The connecting member 23 is connected to an axial center of the first roller 21 and an axial center of the second roller 22. The first roller 21 and the second roller 22 can rotate themselves on the connecting member 23, or the connecting member 23 can serve as a rotation handle to drive the first roller 21 and the second roller 22 to simultaneously rotate in the accommodating cavity 100.

The supporting layer 30 is wrapped around the first roller 21 and the second roller 22, a wrapping direction of the supporting layer 30 on the first roller 21 is opposite to a wrapping direction of the supporting layer 30 on the second roller 22. The supporting layer 30 extends out of the casing 10 through the opening 11.

With reference to FIG. 1, an end of the supporting layer 30 is fixed in the casing 10, can be bonded on an inner wall of the casing 10, and can be fixed in the casing 10 by a fixing member (not shown in the figures). The supporting layer 30 is wrapped from a fixing position to the first roller 21, then is wrapped around the second roller 22 with a counterclockwise wrapping direction, then is wrapped from the second roller 22 to the opening 11 with a clockwise wrapping direction. In other words, the wrapping direction of the supporting layer 30 on first roller 21 is opposite to the wrapping direction thereof on the second roller 22.

Of course, the wrapping direction of the supporting layer 30 can be opposite to the wrapping direction in FIG. 1, i.e., the the supporting layer 30 is wrapped from a fixing position to the second roller 22, then is wrapped around the first roller 21 with a clockwise wrapping direction, and is wrapped from the first roller 21 to the opening 11 with a counterclockwise wrapping direction. Both the two wrapping ways are adequate as long as it is guaranteed that the wrapping direction of the supporting layer 30 on the first roller 21 is opposite to the wrapping direction thereof on the second roller 22.

After wrapped completely, the supporting layer 30 extends out of the casing 10 through the opening 11.

The flexible display screen 40 is disposed on the supporting layer 30, is fixed on in the casing 10 along with the supporting layer 30, is wrapped around the first roller 21 and the second roller 22, and then extends out of the casing 10 through the opening 11.

To ensure that the flexible display screen 40 is not damaged when passing through the opening 11, a height of the opening should be greater than a sum of heights of the flexible display screen 40 and the supporting layer 30. In an embodiment, the height of the opening is 450 micrometers.

Similarly, because the flexible display screen 40 and the supporting layer 30 need to be wrapped around the first roller 41 and the second roller 42 and the wrapping directions on the first roller 41 and the second roller 42 are opposite to each other, the first roller 41 should not contact the second roller 42 and a gap should be left therebetween to facilitate the flexible display screen 40 and the supporting layer 30 passing through the gap. In an embodiment, a distance between the first roller 21 and the second roller 22 ranges from 500 micrometers to 1 millimeter.

In an embodiment, a dimension of the first roller 21 is equal to a dimension of the second roller 22. A distance between an axial center of the first roller 21 and an axial center of the casing 10 is equal to a distance between an axial center of the second roller 21 and the axial center of the casing 10. At the meantime, a connection line between a fixing position of the supporting layer 30 in the casing 10 and the opening 11 coincides with a diameter of the casing 10. Because wrapping directions of the flexible display screen 40 respectively on first roller 21 and the second roller 22 are opposite to each other, when dimensions of the first roller 21 and the second roller 22 are equal, stresses on the curling flexible display screen 40 cancel each other out, which reduces the risk of rupture and damage of the flexible display screen 40.

In an embodiment, the dimension of the first roller 21 is not equal to the dimension of the second roller 22. A diameter of the first roller 21 is greater than a diameter of the second roller 22 diameter. At the meantime, the connection line between the fixing position of the supporting layer 30 in the casing 10 and the opening 11 can coincide with or not coincide with the diameter of the casing 10. Because wrapping directions of the flexible display screen 40 respectively on first roller 21 and the second roller 22 are opposite to each other, when dimensions of the first roller 21 and the second roller 22 are equal, stresses on the curling flexible display screen 40 cancel each other out in a certain extent, which reduces the risk of rupture and damage of the flexible display screen 40.

In the present embodiment, the flexible display device further comprises an adhesive layer (not shown in the figures). The adhesive layer is disposed between the supporting layer 30 and the flexible display screen 40, flexible display screen 40 is fixed on the supporting layer 30 by the adhesive layer. Material of the adhesive layer can be made of optical clear adhesive adhering the flexible display screen 40 and the supporting layer 30 after curing. However, the present invention is not limited thereto. Other material for fixing the flexible display screen 40 on the supporting layer 30 can form an adhesive layer.

The supporting layer 30 is usually a rectangular structure and has a better bending and curling characteristic. Furthermore, a stretching amount thereof is very small under a certain pulling force. The supporting layer 30 is usually made of stainless steel or amorphous material. In an embodiment, a thickness of the supporting layer 30 ranges from 20 to 30 micrometers.

An area of the flexible display screen 40 can be equal to an area of the supporting layer 30, i.e., a dimension and a shape of the flexible display screen 40 are equal to a dimension and a shape of the supporting layer 30. When the flexible display screen 40 is pulled and flattened, an extending portion thereof out of the casing 10 displays images, and an portion thereof inside the casing 10 does not display.

The area of the flexible display screen 40 can also be less than the area of the supporting layer 30.

In an embodiment, the flexible display screen 40 is a rectangular structure, a width of the flexible display screen 40 is equal to a width of the supporting layer 30, and a length of the flexible display screen 40 is less than a length of the supporting layer 30. When the flexible display screen 40 is pulled and flattened, the flexible display screen 40 is not received in the casing 10, i.e., under a pulled and flattened status, the flexible display screen 40 is merely disposed in a region outside the casing 10, and at the meantime the entire flexible display screen 40 displays images.

In an embodiment, the flexible display screen 40 is a rectangular structure, a width of the flexible display screen 40 is less than a width of the supporting layer 30 such that the opening 11 is prevented from damaging two sides of the flexible display screen when the flexible display screen 40 is pulled out from or retracted into the casing 10 through the opening 11.

In an embodiment, flexible display screen 40 is a irregular screen disposed on the supporting layer 30 for interesting.

The flexible display screen 40 is disposed on the supporting layer 30 such that when the supporting layer 30 is wrapped around the first roller 21 and the second roller 22 and is stretched, the flexible display screen 40 does not directly contact one of the rollers such that a risk of a side surface of the cylindrical roller damaging flexible display screen 40 is reduced.

At the same time, during the process of the flexible display screen 40 extending out of or retracted back into the casing 10, because the flexible display screen 40 is fitted on a surface of the supporting layer 30, a stretching force is exerted on the supporting layer 30, and the flexible display screen 40 is almost not forced. Thus, the flexible display screen 40 is effectively protected, the lifespan of the flexible display screen 40 is prolonged to prevent the flexible display screen 40 from suffering force to be damaged.

When the flexible display screen 40 is required to display, the flexible display screen 30 is pulled to extend left out from the opening 11, or the connecting member 23 is grabbed and rotated clockwise, or the supporting layer 30 is pulled left and while the connecting member 23 is grabbed and rotated clockwise, to pull out the most part of the flexible display screen 40 out of the casing.

Figure 2:
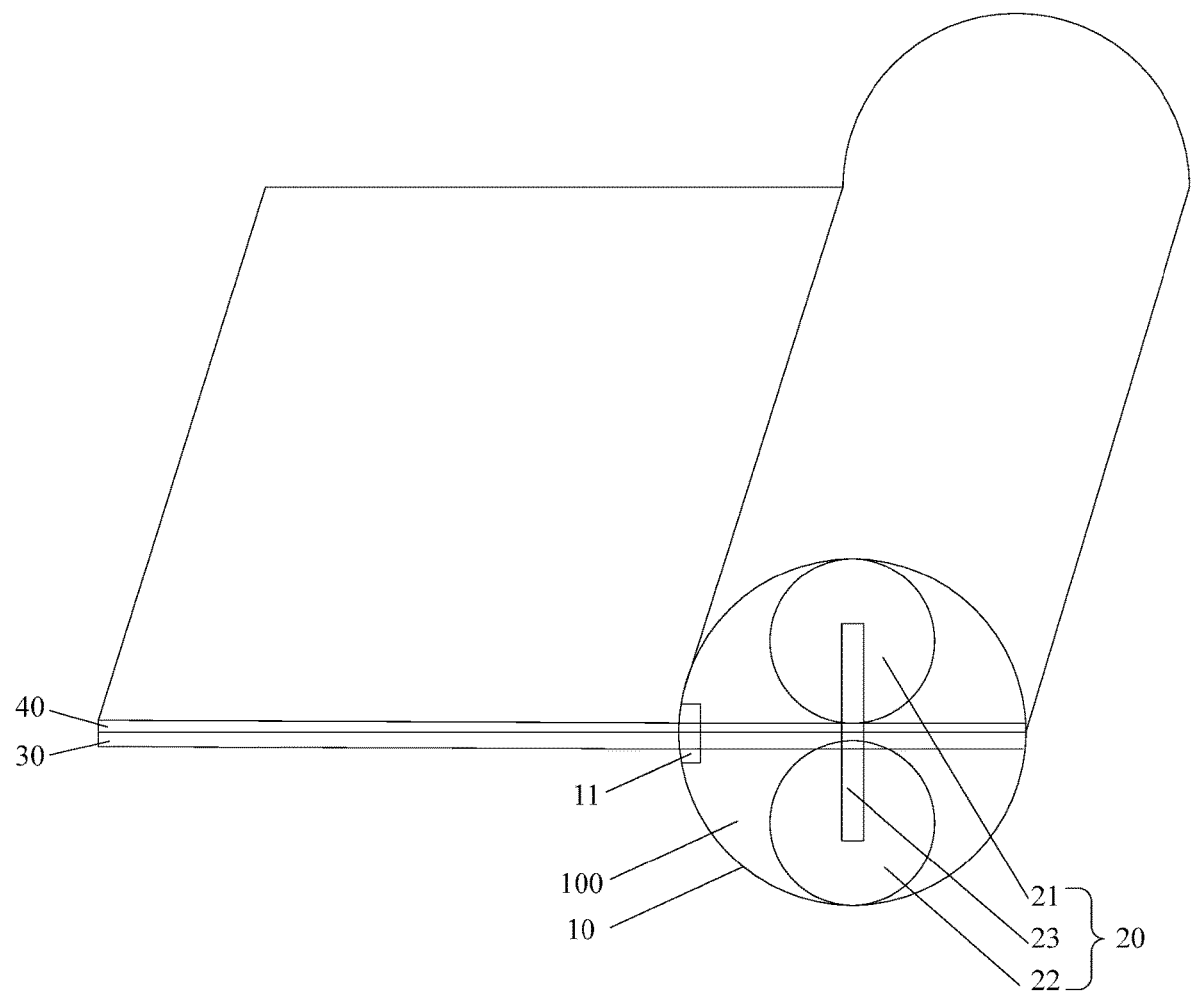
FIG. 2 is a schematic view of a first structure of a flexible display screen provided by an embodiment of the present invention pulled out of a casing.

With reference to FIG. 2, FIG. 2 is a schematic view of a first structure of a flexible display screen provided by an embodiment of the present invention pulled out of a casing. At the meantime, the entire supporting layer 30 parallels a level surface, a right side of the supporting layer 30 is stilled fixed on the inner wall of the casing 10. A connection line between the first roller 21 and the second roller 22 is perpendicular to the supporting layer 30, in other words in the accommodating cavity 100, the supporting layer 30 is no longer wrapped around the first roller 21 and the second roller 23. At the meantime, the first roller 21 and the second roller 23 do not contact the supporting layer 30 and the flexible display screen 40. An exposed part of the flexible display screen 40 out of the casing 10 can display images.

After displaying is completed, the flexible display screen 40 is required to be retracted back into the casing 10. At the meantime, the connecting member 23 is grabbed and rotated clockwise or counterclockwise, the first roller 21 and the second roller 22 dive the supporting layer 30 to rotate, and the supporting layer 30 is gradually wrapped around the first roller 21 and the second roller 22 until it is retracted completely back into the casing 10.

In an embodiment, the flexible display device further comprises a drive member (not shown in the figures), the drive member drives the roller assembly 20 to rotate to retract the supporting layer 30 back into the casing 10. In other words, there is no need to manually grab the connecting member 23 to rotate, the roller assembly 20 is directly driven by the drive member to rotate to retract the supporting layer 30 back into the casing 10.

When the supporting layer 30 is retracted back into the casing 10, two conditions occur.

Figure 3:
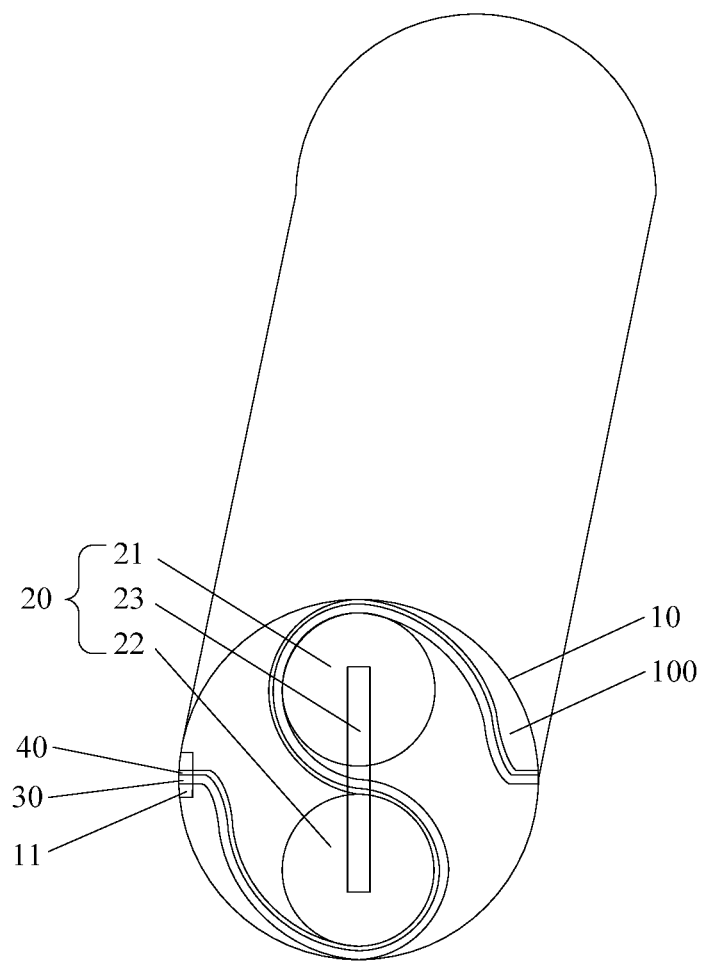
FIG. 3 is a schematic view of a first structure of the flexible display screen provided by an embodiment of the present invention retracted back into the casing.

In an embodiment, with reference to FIG. 3, it starts from the connection line between the first roller 21 and the second roller 22 being perpendicular to the supporting layer 30 until the supporting layer 30 is retracted completely back into the casing 10, and the roller assembly 20 just rotates for a circumference in the casing 10, or rotates for a distance less than a circumference. Wrapping directions of the flexible display screen 40 respectively on the first roller 21 and the second roller 22 are opposite such that stresses on the curling flexible display screen 40 cancel each other out in a certain extent, which reduces a risk of damage of the flexible display screen 40.

Figure 4:
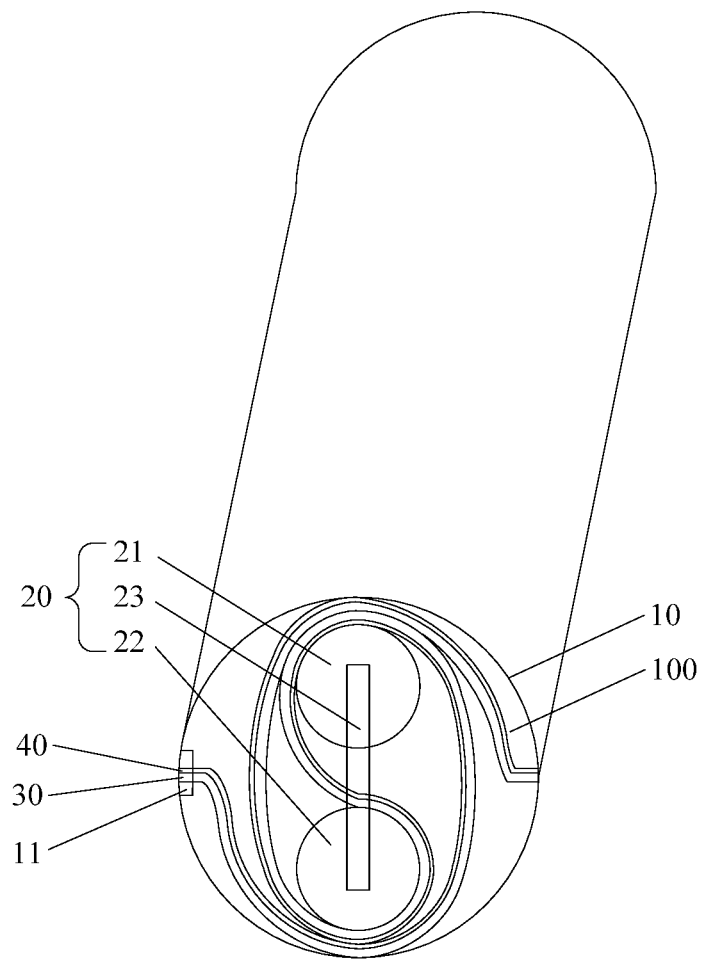
FIG. 4 is a schematic view of a second structure of a flexible display screen provided by an embodiment of the present invention retracted back into the casing.

In an embodiment, with reference to FIG. 4, it starts from the connection line between the first roller 21 and thee second roller 22 being perpendicular to the supporting layer 30 until the supporting layer 30 is retracted completely back into the casing 10, the roller assembly 20 rotates for more than a circumference in the casing 10. At the meantime, an "axis body" with a greater diameter, defined commonly by the first roller 21, the second roller 22, and the outer supporting layer 30 and flexible display screen 40, is formed in the casing 10. During later rolling, the supporting layer 30 and the flexible display screen 40 are continuously wrapped around the "axis body" until they are retracted completely back into the casing 10.

In an inner layer of the "axis body", the wrapping directions of the flexible display screen 40 respectively on the first roller 21 and the second roller 22 are opposite to each other such that stresses on the curling flexible display screen 40 cancel each other out in a certain extent, which reduces the risk of rupture and damage of the flexible display screen 40. In an outer layer of the "axis body", the flexible display screen 40 including a greater curling radius reduces the stress on the flexible display screen 40 during curling, which further reduces the risk of damage of the flexible display screen 40.

The embodiment of the present invention, by adopting such design of dual-roller sync-rolling, the flexible display screen 40 can be rolled up or opened in a shorter time. by disposing the roller assembly 20 in the casing 10, the wrapping directions of the flexible display screen 40 respectively on the first roller 21 and the second roller 22 are opposite to each other such that stresses on the curling flexible display screen 40 cancel each other out in a certain extent, which reduces the risk of rupture and damage of the flexible display screen 40. Furthermore, disposing the supporting layer 30 assures flatness performed by the flexible display screen 40 during using and reduces ripples formed by the curling flexible display screen 40 such that the flexible display screen 40 is almost not forced when extending out of or retracted back into the casing 10, the stress is exerted on the supporting layer 30 and further mitigates a risk of rupture of the forced flexible display screen.

Finally, because the rolled flexible display screen 30 is completely stored in the roller casing, no additional protective casing is needed, which facilitates carriage.

Figure 5:
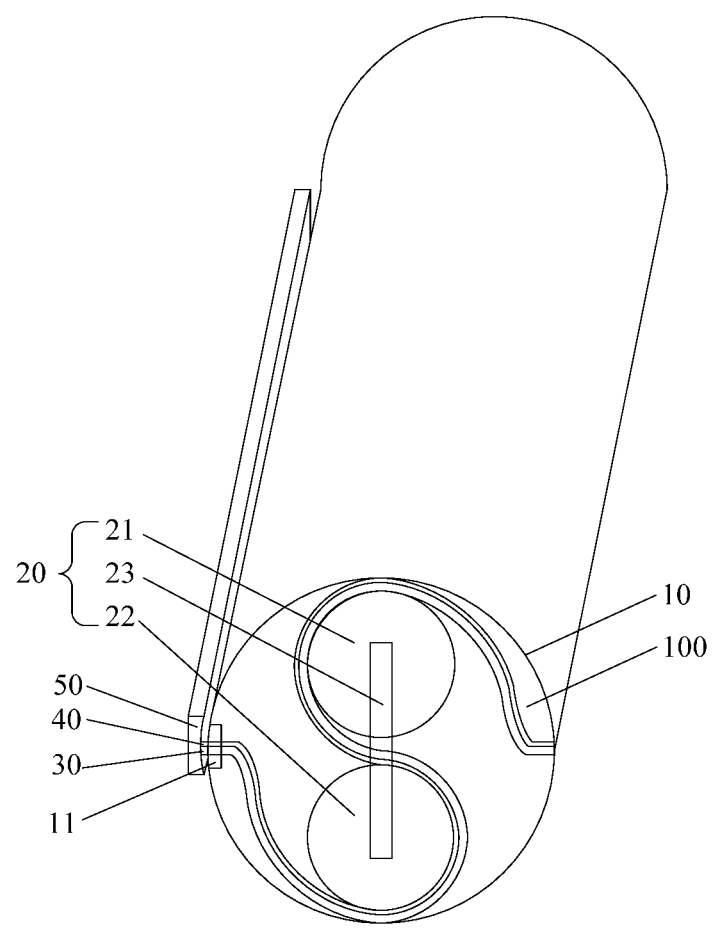
FIG. 5 is a schematic view of a second structure of a flexible display device of an embodiment of the present invention.

With reference to FIG. 5, FIG. 5 is a schematic view of a second structure of a flexible display device of an embodiment of the present invention. The flexible display device comprises a casing 10, a roller assembly 20, a supporting layer 30, and a flexible display screen 40.

A difference of the structure thereof from the structure in FIG. 1 is that, in the present embodiment the flexible display device further comprises a protective member 50. The protective member 50 is connected to an end of the supporting layer 30. A dimension of the protective member 50 is greater than a dimension of the opening 11. During a process of pulling the supporting layer 30 and the flexible display screen 40 out of the casing 10, the protective member 50 can serve as a handle. In other words, pulling the protective member 50 pulls the supporting layer 30 out of the casing 10. During a process of retracting the supporting layer 30 and the flexible display screen 40 back into the casing 10, because the dimension of the protective member 50 is greater than the dimension of the opening 11, in the final status the protective member 50 is still left outside of the casing 10, which prevents the flexible display screen 40 from entirely falling into the casing 10 and failing to be pulled out again.

A width of the protective member 50 can be greater than a width of the opening 11 width, or a height of the protective member 50 can be greater than a height of the opening 11, or both the width and the height of the protective member 50 are greater than those of the opening 11. A person of ordinary skill in the art can design according demands.

Figure 6:
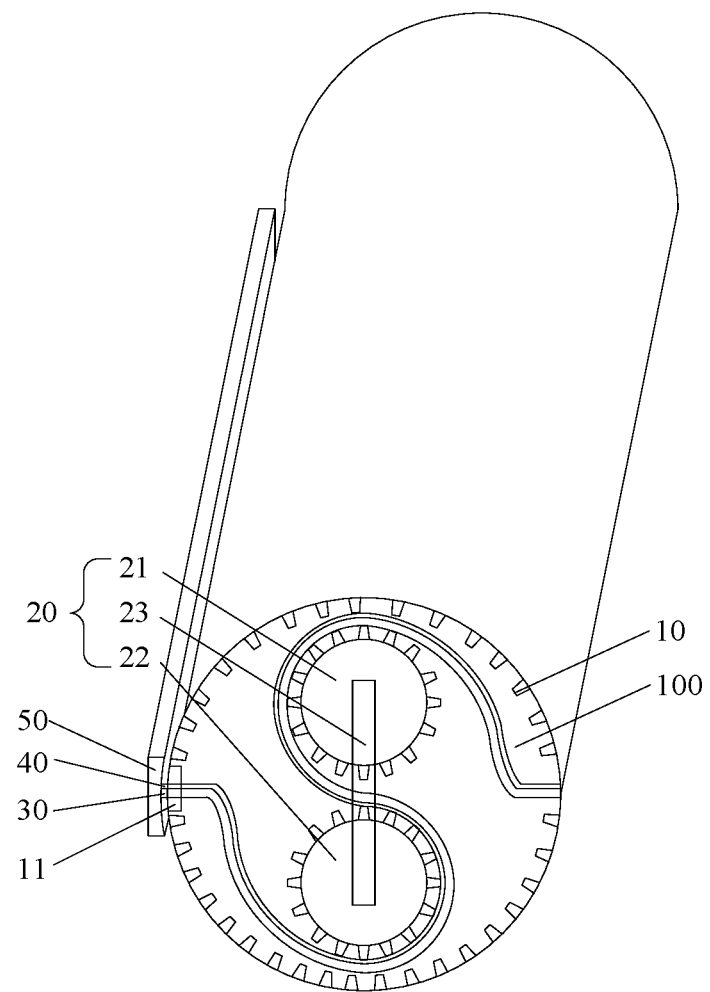
FIG. 6 is a schematic view of a third structure of a flexible display device of an embodiment of the present invention.

With reference to FIG. 6, FIG. 6 is a schematic view of a third structure of a flexible display device of an embodiment of the present invention. The flexible display device comprises a casing 10, roller assembly 20, a supporting layer 30, and a flexible display screen 40.

A difference of the structure thereof from the structure in FIG. 5 is that, in the present embodiment, the first roller 21 and the second roller 22 are outer gears, the casing 10 is an inner gear, and outer gears are engaged with the inner gear. Such way of engagement of the gears makes when the supporting layer 30 is pulled out of and retracted back into the casing 10, the first roller 21 and the second roller 22 rotates more smoothly relative to the casing 10 and a pulling force exerted on the supporting layer 30 becomes smaller to prevent damage of the supporting layer 30 and the flexible display screen due to excessive force exerted thereon.

Figure 7:
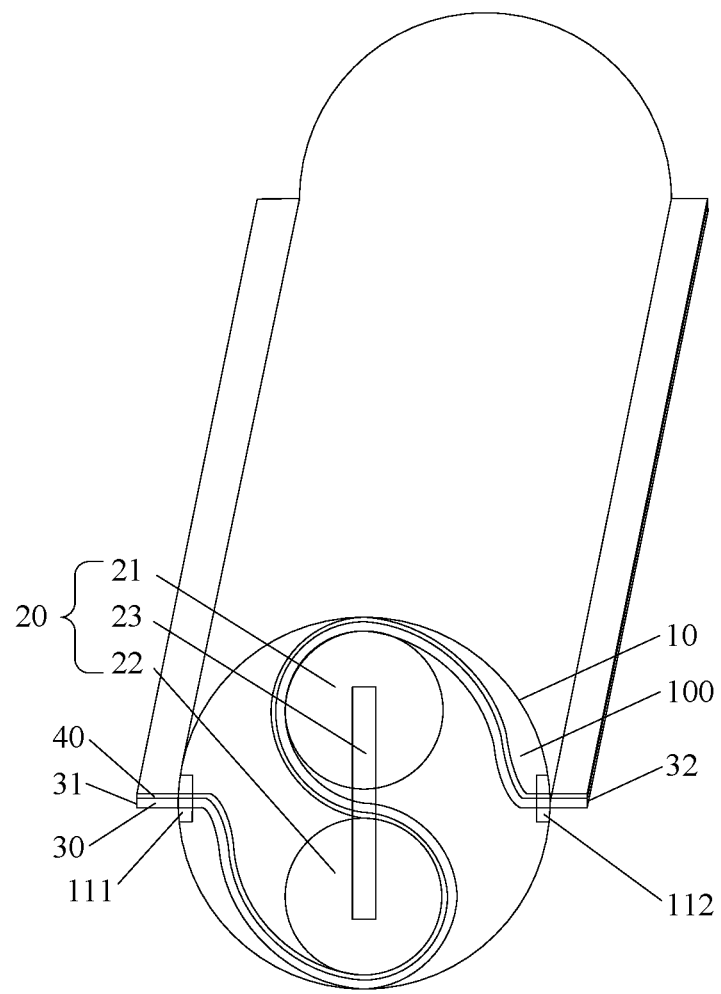
FIG. 7 is a schematic view of a fourth structure of a flexible display device of an embodiment of the present invention.

With reference to FIG. 7, FIG. 7 is a schematic view of a fourth structure of a flexible display device of an embodiment of the present invention. The flexible display device comprises a casing 10, a roller assembly 20, a supporting layer 30, and a flexible display screen 40.

The casing 10 is cylindrical, an accommodating cavity 100 is defined therein. A first opening 111 and a second opening 112 are defined in a side surface of the casing 10.

The roller assembly 20 is disposed in the accommodating cavity 100 and comprises a first roller 21, a second roller 22, and a connecting member 23 connected to the first roller 21 and the second roller 22. Axial lines of the first roller 21 and the second roller 22 parallel an axial line of the casing 10.

In the present embodiment, both the first roller 21 and the second roller 22 are cylinders, and a side surface of each cylinder is a smooth surface. The connecting member 23 is connected to an axial center of the first roller 21 and an axial center of the second roller 22. The first roller 21 and the second roller 22 can rotate themselves on the connecting member 23, or the connecting member 23 can serve as a rotation handle to drive the first roller 21 and the second roller 22 to simultaneously rotate in the accommodating cavity 100.

In the present embodiment, the opening of the casing 10 comprises a first opening 111 and a second opening 112. A first end 31 of the supporting layer 30 extends out of the casing 10 through the first opening 111, is wrapped around the second roller 22 through the first opening 111, is further wrapped around the first roller 21 with a counterclockwise wrapping direction, then is wrapped from the first roller 21 to the second opening 112 with a clockwise wrapping direction. A second end 32 of the supporting layer extends out of the casing 10 through the second opening 112. In other words, the wrapping directions of the supporting layer 30 respectively on the first roller 21 and the second roller 22 are opposite to each other.

Of course, the wrapping direction of the supporting layer 30 can be opposite to that in FIG. 1, i.e., the supporting layer 30 is wrapped through the first opening 111 around the first roller 21, then is wrapped around the second roller 22 with the wrapping direction being clockwise, then is wrapped from the second roller 22 to the second opening 112 with the wrapping direction being counterclockwise. Both the two wrapping ways are adequate as long as it is guaranteed that the wrapping direction of the supporting layer 30 on the first roller 21 is opposite to the wrapping direction thereof on the second roller 22.

The flexible display screen 40 is disposed on the supporting layer 30, is wrapped around the first roller 21 and the second roller 22 with the supporting layer 30, and then extends out of the casing 10 through the first opening 111 and the second opening 112.

To ensure that the flexible display screen 40 is not damaged when passing through the first opening 111 and the second opening 112, a height of each of the first opening 111 and the second opening 112 should be greater than a sum of heights of the flexible display screen 40 and the supporting layer 30. In an embodiment, the height of each of the first opening 111 and the second opening 112 is 450 micrometers.

Similarly, because the flexible display screen 40 and the supporting layer 30 need to be wrapped around the first roller 41 and the second roller 42 and the wrapping directions on the first roller 41 and the second roller 42 are opposite to each other, the first roller 41 should not contact the second roller 42 and a gap should be left therebetween to facilitate the flexible display screen 40 and the supporting layer 30 passing through the gap. In an embodiment, a distance between the first roller 21 and the second roller 22 ranges from 500 micrometers to 1 millimeter.

In an embodiment, a dimension of the first roller 21 is equal to a dimension of the second roller 22. A distance between an axial center of the first roller 21 and an axial center of the casing 10 is equal to a distance between an axial center of the second roller 21 and the axial center of the casing 10. At the meantime, a connection line between the first opening 111 and the second opening 112 coincides with a diameter of the casing 10. Because wrapping directions of the flexible display screen 40 respectively on first roller 21 and the second roller 22 are opposite to each other, when dimensions of the first roller 21 and the second roller 22 are equal, stresses on the curling flexible display screen 40 cancel each other out, which reduces the risk of rupture and damage of the flexible display screen 40

In an embodiment, the dimension of the first roller 21 is not equal to the dimension of the second roller 22. A diameter of the first roller 21 is greater than a diameter of the second roller 22 diameter. At the meantime, the connection line between the first opening 111 and the second opening 112 coincides with or does not coincide with a diameter of the casing 10. Because wrapping directions of the flexible display screen 40 respectively on first roller 21 and the second roller 22 are opposite to each other, when dimensions of the first roller 21 and the second roller 22 are equal, stresses on the curling flexible display screen 40 cancel each other out in a certain extent, which reduces the risk of rupture and damage of the flexible display screen 40.

In the present embodiment, the flexible display device further comprises an adhesive layer (not shown in the figures). The adhesive layer is disposed between the supporting layer 30 and the flexible display screen 40. The flexible display screen 40 is fixed on the supporting layer 30 by the adhesive layer. Material of the adhesive layer can be made of optical clear adhesive adhering the flexible display screen 40 and the supporting layer 30 after curing. However, the present invention is not limited thereto. Other material for fixing the flexible display screen 40 on the supporting layer 30 can form an adhesive layer.

The supporting layer 30 is usually a rectangular structure and has a better bending and curling characteristic. Furthermore, a stretching amount thereof is very small under a certain pulling force. The supporting layer 30 is usually made of stainless steel or amorphous material. In an embodiment, a thickness of the supporting layer 30 ranges from 20 to 30 micrometers.

An area of the flexible display screen 40 can be equal to an area of the supporting layer 30, i.e., a dimension and a shape of the flexible display screen 40 are equal to a dimension and a shape of the supporting layer 30. When the flexible display screen 40 is pulled and flattened, an extending portion thereof out of the casing 10 displays images, and an portion thereof inside the casing 10 does not display.

The area of the flexible display screen 40 can also be less than the area of the supporting layer 30.

In an embodiment, the flexible display screen 40 is a rectangular structure, a width of the flexible display screen 40 is equal to a width of the supporting layer 30, and a length of the flexible display screen 40 is less than a length of the supporting layer 30. When the flexible display screen 40 is pulled and flattened, the flexible display screen 40 is not received in the casing 10, i.e., under a pulled and flattened status, the flexible display screen 40 is merely disposed in a region outside the casing 10, and at the meantime the entire flexible display screen 40 displays images.

In an embodiment, the flexible display screen 40 is a rectangular structure, a width of the flexible display screen 40 is less than a width of the supporting layer 30 such that the first opening 111 and the second opening 112 are prevented from damaging two sides of the flexible display screen when the flexible display screen 40 is pulled out from or retracted into the casing 10 through first opening 111 and the second opening 112.

In an embodiment, flexible display screen 40 is a irregular screen disposed on the supporting layer 30 for interesting.

The flexible display screen 40 is disposed on the supporting layer 30 such that when the supporting layer 30 is wrapped around the first roller 21 and the second roller 22 and is stretched, the flexible display screen 40 does not directly contact one of the rollers such that a risk of a side surface of the cylindrical roller damaging flexible display screen 40 is reduced.

At the same time, during the process of the flexible display screen 40 extending out of or retracted back into the casing 10, because the flexible display screen 40 is fitted on a surface of the supporting layer 30, a stretching force is exerted on the supporting layer 30, and the flexible display screen 40 is almost not forced. Thus, the flexible display screen 40 is effectively protected, the lifespan of the flexible display screen 40 is prolonged to prevent the flexible display screen 40 from suffering force to be damaged.

In the present embodiment, when the flexible display screen 40 is required to display, the flexible display screen 30 is pulled to extend left out from the first opening 111 and the flexible display screen 30 is pulled to extend right out from the second opening 112, or the connecting member 23 is grabbed and rotated clockwise, or the supporting layer 30 is pulled left or right while the connecting member 23 is grabbed and rotated clockwise, to pull out the most part of the flexible display screen 40 out of the casing.

Figure 8:
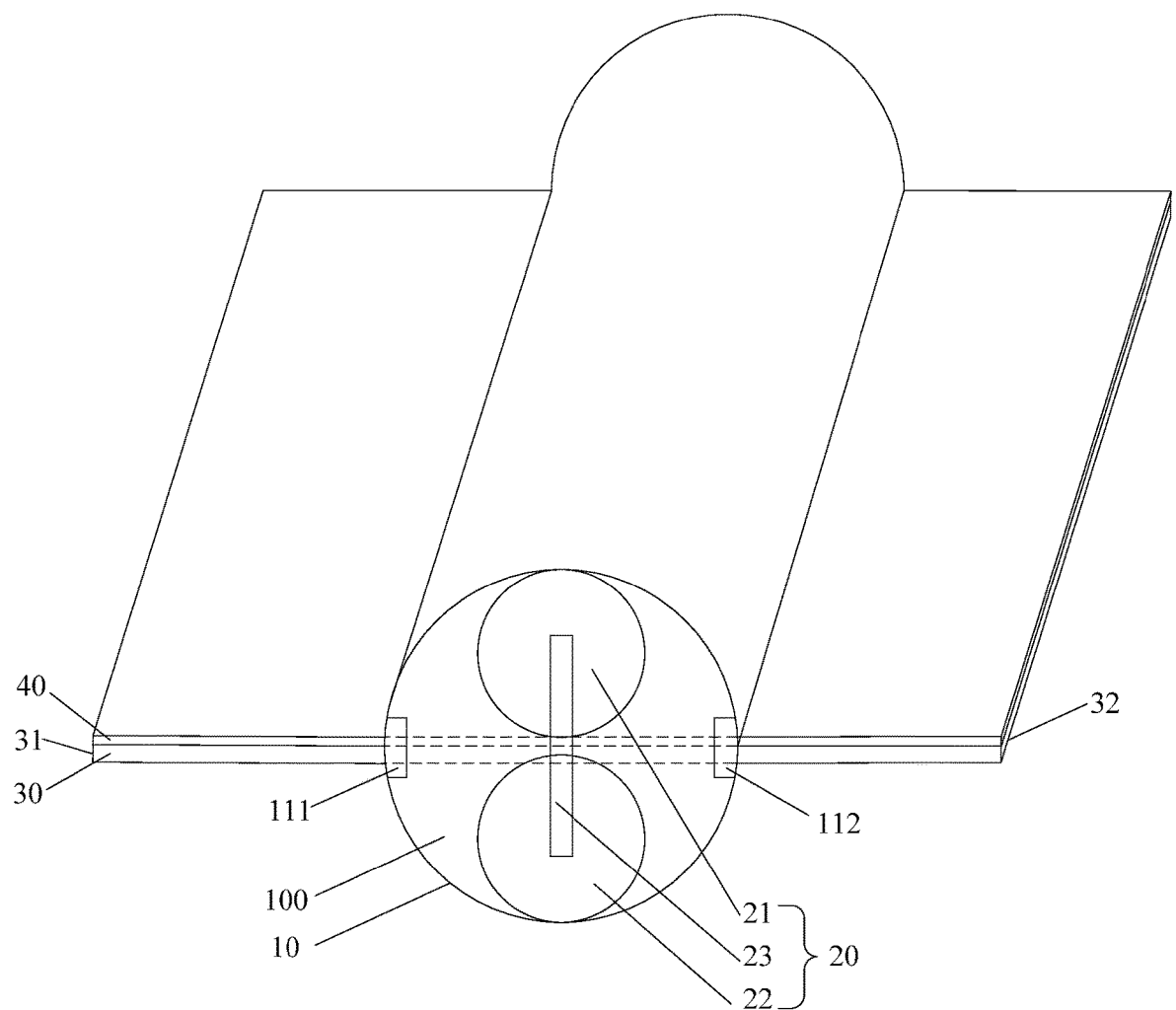
FIG. 8 is a schematic view of a second structure of a flexible display screen provided by an embodiment of the present invention pulled out of a casing.

With reference to FIG. 8, FIG. 8 is a schematic view of a second structure of a flexible display screen provided by an embodiment of the present invention pulled out of a casing. At the meantime, the first end 31 of the supporting layer 30 extends out of the first opening 111, the second end 32 of the supporting layer 30 extends out of the second opening 112. The entire supporting layer 30 parallels a level surface. A connection line between the first roller 21 and the second roller 22 is perpendicular to the supporting layer 30, in other words in the accommodating cavity 100, the supporting layer 30 is no longer wrapped around the first roller 21 and the second roller 23. At the meantime, the first roller 21 and the second roller 23 do not contact the supporting layer 30 and the flexible display screen 40. An exposed part of the flexible display screen 40 out of the casing 10 can display images.

Because two openings are defined in the casing 10 of the present embodiment, when the supporting layer 30 is pulled out of the casing 10, the way of simultaneously pulling from two sides further reduces retracting time of the flexible display screen 40.

When the supporting layer 30 is pulled out of the casing 10 and is in a status of the connection line between the first roller 21 and the second roller 22 being perpendicular to the supporting layer 30, a channel is defined by the first opening 111 and the second opening 112, and the casing 10 can move parallelly on the supporting layer 30 along a direction paralleling the supporting layer 30. At the moment of the supporting layer 30 pulled out from the casing 10, stretching amounts on left and right ends are similar such that the casing 10 will be located at a middle position of the pulled and straightened flexible display screen 40 for better displaying performance of the flexible display screen 40. The casing 10 can be moved along the direction paralleling the supporting layer 30 to a left-most side or a right-most side of the supporting layer 30, which has no influence on displayed images of the flexible display screen 40.

After displaying is completed, the flexible display screen 40 is required to be retracted back into the casing 10. At the meantime, the connecting member 23 is grabbed and rotated clockwise or counterclockwise, the first roller 21 and the second roller 22 dive the supporting layer 30 to rotate, and the supporting layer 30 is gradually wrapped around the first roller 21 and the second roller 22 until it is retracted completely back into the casing 10.

In an embodiment, the flexible display device further comprises a drive member (not shown in the figures), the drive member drives the roller assembly 20 to rotate to retract the supporting layer 30 back into the casing 10. In other words, there is no need to manually grab the connecting member 23 to rotate, the roller assembly 20 is directly driven by the drive member to rotate to retract the supporting layer 30 back into the casing 10.

When the supporting layer 30 is retracted into the casing 10, because the supporting layer 30 is retracted inward from the two openings, retracting amounts thereof on the left and right ends are similar. Therefore, before retracting, the casing is moved to the middle position of the supporting layer 30 along the direction paralleling the supporting layer 30 first, and then the retracting operation is implemented to ensure that the left and right ends thereof are simultaneously retracted back into the casing 10, which prevents a condition of one end retracted back into the casing 10 and the other end exposed out of the casing 10.

Figure 9:
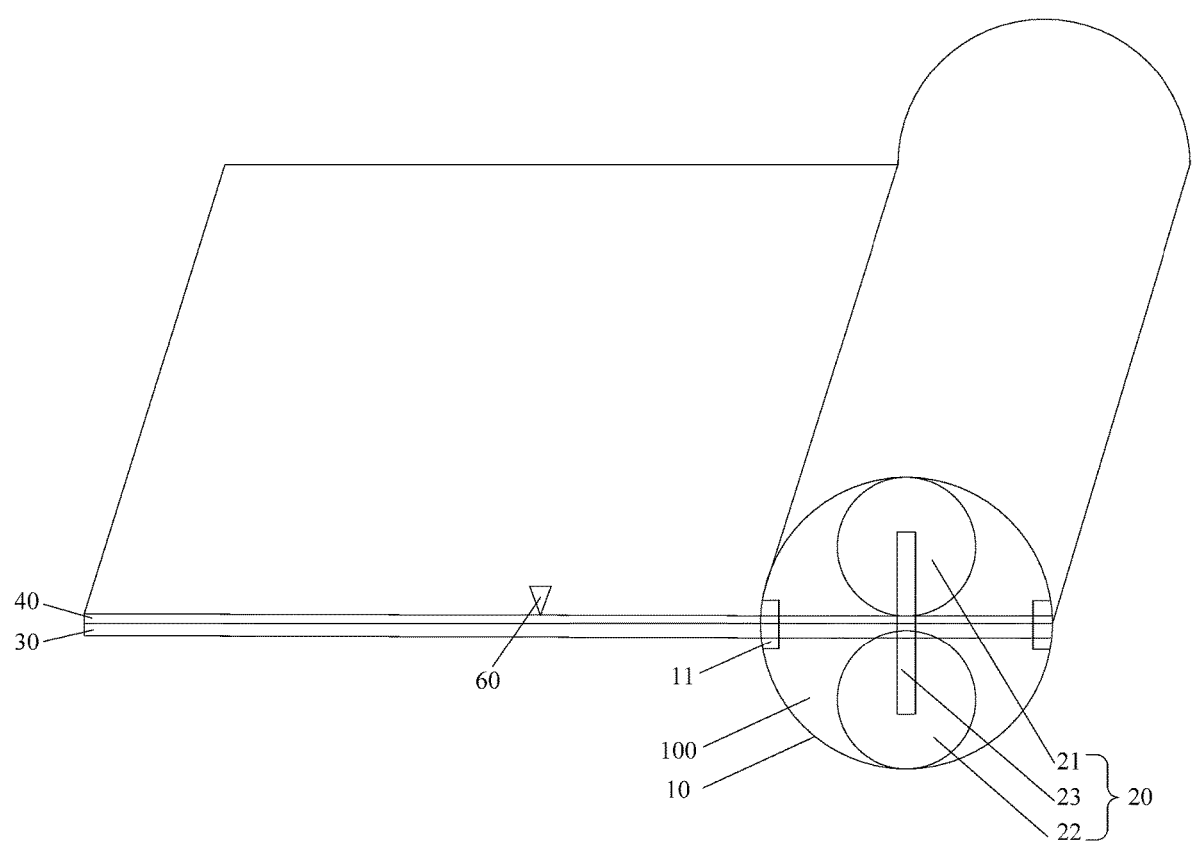
FIG. 9 is a schematic view of a position of a mark of a flexible display device provided by an embodiment of the present invention.

In an embodiment, with reference to FIG. 9, a mark 60 is disposed on the flexible display device, and the mark 60 is configured to mark the middle position of the supporting layer 30.

The mark 60 can be disposed on the flexible display screen 40, and can be disposed on the supporting layer 30. The mark 60 can only be disposed on a side of the supporting layer 30 or a side of the flexible display screen 40, and can be disposed on both sides thereof. A shape of the mark 60 can be set as required, no specific demand for the mark 60 as long as the mark 60 can indicate the middle position of the supporting layer 30. When the supporting layer 30 is retracted back into the casing 10, The casing 10 is slid to a middle position of the supporting layer 30, then a retracting operation is implemented.

When the supporting layer 30 is retracted back into the casing 10, two conditions occur.

Figure 10:
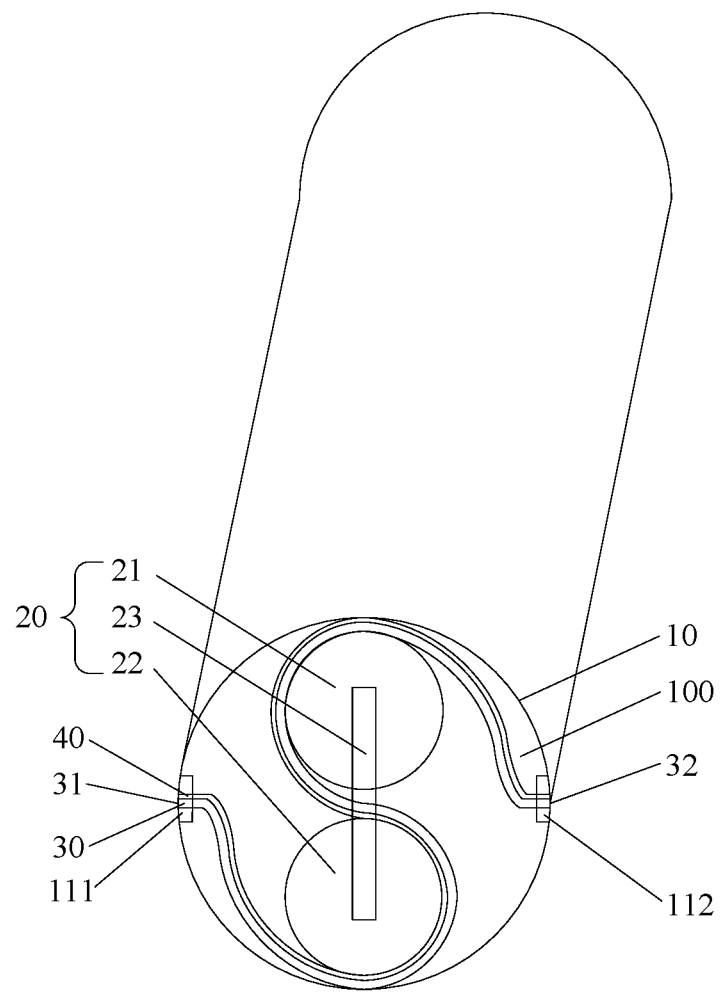
FIG. 10 is a schematic view of a third structure of a flexible display screen provided by an embodiment of the present invention retracted back into the casing.

In an embodiment, with reference to FIG. 10, it starts from the connection line between the first roller 21 and the second roller 22 being perpendicular to the supporting layer 30 until the supporting layer 30 is retracted completely back into the casing 10, and the roller assembly 20 just rotates for a circumference in the casing 10, or rotates for a distance less than a circumference. Wrapping directions of the flexible display screen 40 respectively on the first roller 21 and the second roller 22 are opposite such that stresses on the curling flexible display screen 40 cancel each other out in a certain extent, which reduces a risk of damage of the flexible display screen 40.

By reasonably setting the dimension of the roller and the length of the flexible display screen 40, a rotational angle needed for the flexible display screen 40 to be retracted into the casing 10. In an embodiment, it is assumed that the dimensions of the first roller 21 and the second roller 22 are equal, and the connection line between the first opening 111 and the second opening 112 coincides with the diameter of the casing 10, the length flexible display screen 40 is set as L, each of the first roller 21 and the second roller 22 is set as r, r is from $L/2\pi$ to $L/(2\pi+2.83)$, a radius of the casing is set as R, R is about (r+1.5) millimeters. At the meantime, the roller assembly 20 just rotates for a circumference in the casing 10.

Figure 11:
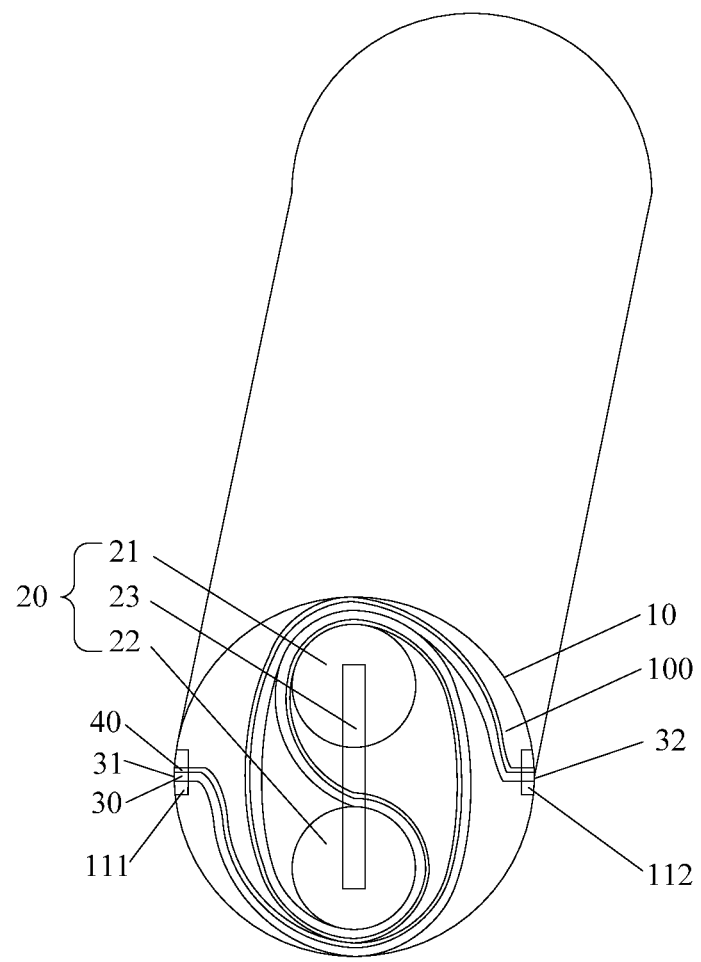
FIG. 11 is a schematic view of a fourth structure of a flexible display screen provided by an embodiment of the present invention retracted back into the casing.

In an embodiment, with reference to FIG. 11, it starts from the connection line between the first roller 21 and thee second roller 22 being perpendicular to the supporting layer 30 until the supporting layer 30 is retracted completely back into the casing 10, the roller assembly 20 rotates for more than a circumference in the casing 10. At the meantime, an "axis body" with a greater diameter, defined commonly by the first roller 21, the second roller 22, and the outer supporting layer 30 and flexible display screen 40, is formed in the casing 10. During later rolling, the supporting layer 30 and the flexible display screen 40 are continuously wrapped around the "axis body" until they are retracted completely back into the casing 10.

In an inner layer of the "axis body", the wrapping directions of the flexible display screen 40 respectively on the first roller 21 and the second roller 22 are opposite to each other such that stresses on the curling flexible display screen 40 cancel each other out in a certain extent, which reduces the risk of rupture and damage of the flexible display screen 40. In an outer layer of the "axis body", the flexible display screen 40 including a greater curling radius reduces the stress on the flexible display screen 40 during curling, which further reduces the risk of damage of the flexible display screen 40.

The embodiment of the present invention, by adopting such design of dual-roller sync-rolling, the flexible display screen 40 can be rolled up or opened in a shorter time. by disposing the roller assembly 20 in the casing 10, the wrapping directions of the flexible display screen 40 respectively on the first roller 21 and the second roller 22 are opposite to each other such that stresses on the curling flexible display screen 40 cancel each other out in a certain extent, which reduces the risk of rupture and damage of the flexible display screen 40. Furthermore, disposing the supporting layer 30 assures flatness performed by the flexible display screen 40 during using and reduces ripples formed by the curling flexible display screen 40 such that the flexible display screen 40 is almost not forced when extending out of or retracted back into the casing 10, the stress is exerted on the supporting layer 30 and further mitigates a risk of rupture of the forced flexible display screen.

Finally, because the rolled flexible display screen 30 is completely stored in the roller casing, no additional protective casing is needed, which facilitates carriage.

Figure 12:
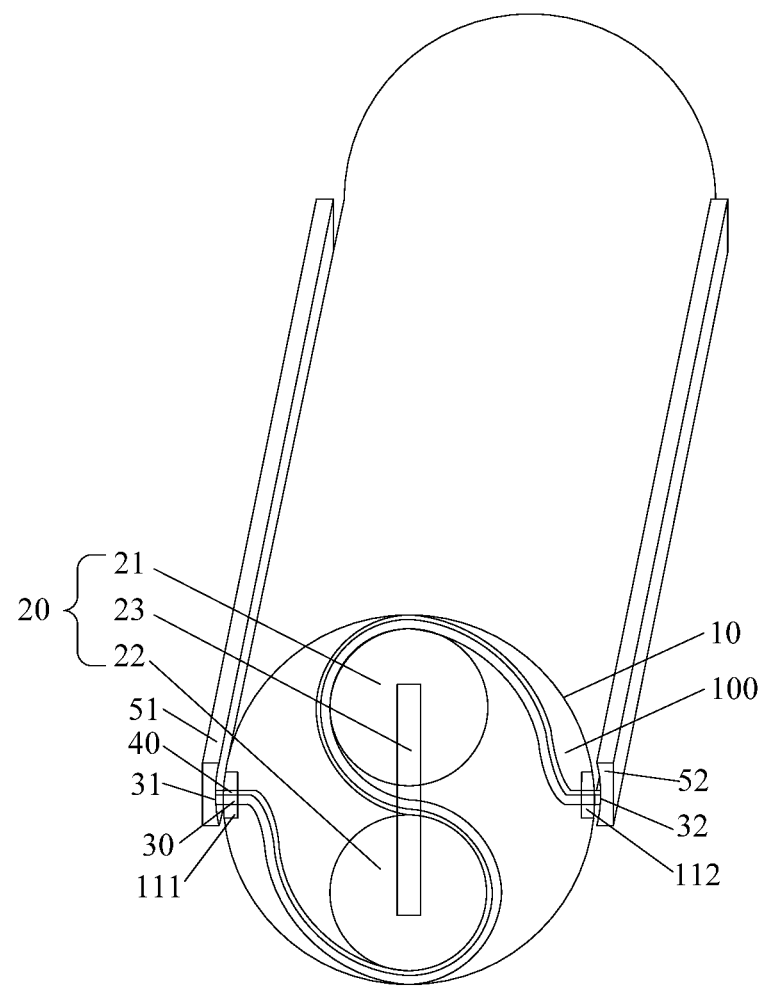
FIG. 12 is a schematic view of a fifth structure of a flexible display device of an embodiment of the present invention.

With reference to FIG. 12, FIG. 12 is a schematic view of a fifth structure of a flexible display device of an embodiment of the present invention. flexible display device comprises a casing 10, roller assembly 20, a supporting layer 30 and a flexible display screen 40.

A difference of the structure thereof from the structure in FIG. 7 is that, in the present embodiment, the flexible display device further comprises a first protective member 51 and a second protective member 52. The first protective member 51 is connected to the first end 31 of the supporting layer 30. The second protective member 52 is connected to the second end 32 of the supporting layer 30. A dimension of the first protective member 51 is greater than a dimension of the first opening 111. A dimension of the second protective member 52 is greater than a dimension of the second opening 112. During a process of pulling the supporting layer 30 and the flexible display screen 40 out of the casing 10, the first protective member 51 and the second protective member 52 can serve as handles. In other words, pulling the first protective member 51 and the second protective member 52 pulls the supporting layer 30 out of the casing 10. During a process of retracting the supporting layer 30 and the flexible display screen 40 back into the casing 10, because the dimension of the first protective member 51 is greater than the dimension of the first opening 111 and the dimension of the second protective member 52 is greater than the dimension of the second opening 112, in the final status the first protective member 51 and the second protective member 52 are still left outside of the casing 10, which prevents the flexible display screen 40 from entirely falling into the casing 10 and failing to be pulled out again.

A width of the first protective member 51 can be greater than a width of the first opening 111, or a height of the first protective member 51 can be greater than a height of the first opening 111, or both the width and height of the first protective member 51 are greater than those of the first opening 111. A person of ordinary skill in the art can design according demands. A design principle of the second protective member 52 is similar and is not described repeatedly herein.

Figure 13:
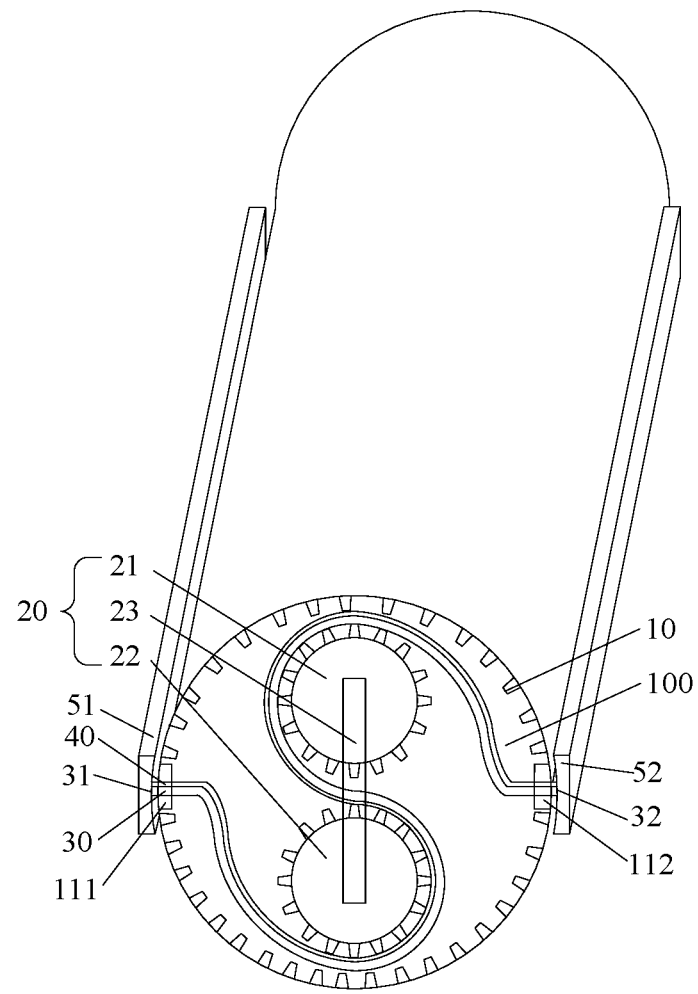
FIG. 13 is a schematic view of a sixth structure of a flexible display device of an embodiment of the present invention.

With reference to FIG. 13, FIG. 13 is a schematic view of a sixth structure of a flexible display device of an embodiment of the present invention. The flexible display device comprises a casing 10, a roller assembly 20, a supporting layer 30, and a flexible display screen 40.

A difference of the structure thereof from the structure in FIG. 12 is that, in the present embodiment, the first roller 21 and the second roller 22 are outer gears, the casing 10 is an inner gear, and outer gears are engaged with the inner gear. Such way of engagement of the gears makes when the supporting layer 30 is pulled out of and retracted back into the casing 10, the first roller 21 and the second roller 22 rotates more smoothly relative to the casing 10 and a pulling force exerted on the supporting layer 30 becomes smaller to prevent damage of the supporting layer 30 and the flexible display screen due to excessive force exerted thereon.

The present invention also provides a terminal comprising a flexible display device. The flexible display device comprises a casing, a roller assembly, a supporting layer, and a flexible display screen, the casing being cylindrical, an accommodating cavity defined in the casing, an opening defined in a side surface of the casing; a roller assembly disposed in the accommodating cavity, comprising a first roller, a second roller, and a connecting member connected to the first roller, and axial lines of the second roller, first roller and the second roller paralleling to an axial line of the casing; the supporting layer wrapped around the first roller and the second roller, and a wrapping direction of the supporting layer on the first roller being opposite to a wrapping direction of the supporting layer on the second roller, and the supporting layer extending out of the casing through the opening; and the flexible display screen disposed on the supporting layer.

In an embodiment, the first roller is equal to the second roller.

In an embodiment, a diameter of the first roller is greater than a diameter of the second roller.

In an embodiment, the flexible display device further comprises a protective member, the protective member is connected an end of the supporting layer, and a dimension of the protective member is greater than a dimension of the opening.

In an embodiment, opening comprises a first opening and a second opening, a first end of the supporting layer extends out of the casing through the first opening, and a second end of the supporting layer extends out of the casing through the second opening.

In an embodiment, a connection line between the first opening and the second opening coincides with a diameter of the casing.

In an embodiment, the flexible display device further comprises a first protective member and a second protective member, the first protective member is connected to the first end, the second protective member is connected to the second end, a dimension of the first protective member is greater than a dimension of the first opening, and a dimension of the second protective member is greater than a dimension of the second opening.

In an embodiment, a mark is disposed on the flexible display device, and the mark is configured to mark the middle position of the supporting layer.

In an embodiment, the mark is disposed on the flexible display screen.

In an embodiment, the mark is disposed on the supporting layer.

In an embodiment, display device further comprises an adhesive layer, the adhesive layer is disposed between the supporting layer and the flexible display screen, and the flexible display screen is fixed on the supporting layer by the adhesive layer.

In an embodiment, material of the adhesive layer is made of optical clear adhesive.

In an embodiment, a thickness of the supporting layer ranges from 20 to 30 micrometers.

In an embodiment, material of the supporting layer is stainless steel.

In an embodiment, an area of the flexible display screen is less than or equal to an area of the supporting layer.

In an embodiment, the first roller and the second roller are outer gears, the casing is an inner gear, the outer gears are engaged with the inner gear.

In an embodiment, a distance between the first roller and the second roller is not less than 500 micrometers and is not greater than 1 millimeters.

In an embodiment, the flexible display device further comprises a drive member, the drive member drives the roller assembly to rotate to retract the supporting layer back into the casing.

According to the Above Embodiment

The present invention provides a flexible display device and a terminal. The flexible display device comprises a casing, a roller assembly, a supporting layer, and a flexible display screen, the casing being cylindrical, an accommodating cavity defined in the casing, an opening defined in a side surface of the casing; a roller assembly disposed in the accommodating cavity, comprising a first roller, a second roller, and a connecting member connected to the first roller, and axial lines of the second roller, first roller and the second roller paralleling to an axial line of the casing; the supporting layer wrapped around the first roller and the second roller, and a wrapping direction of the supporting layer on the first roller being opposite to a wrapping direction of the supporting layer on the second roller, and the supporting layer extending out of the casing through the opening; and the flexible display screen disposed on the supporting layer. Because of using a design of dual roller rotation, the flexible display screen can be opened or retracted in a shorter time. The wrapping directions of the flexible display screen on the first roller and the second roller are opposite such that stresses cancel each other out, which reduces a risk of damage of the flexible display screen due to the stress. At the meantime, disposing the supporting layer, and the stress is exerted on the supporting layer and further mitigates a risk of rupture of the forced flexible display screen the flexible display screen is almost not forced when pulled back into or extending out of the casing, the stress is exerted on the supporting layer and further mitigates a risk of rupture of the forced flexible display screen.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A flexible display device, comprising:
   a casing, the casing being cylindrical, an accommodating cavity defined in the casing, and an opening defined in a side surface of the casing;
   a roller assembly disposed in the accommodating cavity, comprising a first roller, a second roller, and a connecting member connecting the first roller and the second roller, and axial lines of the first roller and the second roller parallel an axial line of the casing;
   a supporting layer wrapped around the first roller and the second roller, a wrapping direction of the supporting layer on the first roller being counter to a wrapping direction of the supporting layer on the second roller, and the supporting layer extending out of the casing through the opening; and
   a flexible display screen disposed on the supporting layer, wherein a mark is disposed on the flexible display device, and the mark is configured to mark up a middle position of the supporting layer.

2. The flexible display device as claimed in claim 1, wherein a dimension of the first roller is equal to a dimension of the second roller.

3. The flexible display device as claimed in claim 1, wherein the flexible display device further comprises a protective member, the protective member is connected to an end of the supporting layer, and a dimension of the protective member is greater than a dimension of the opening.

4. The flexible display device as claimed in claim 1, wherein the opening comprises a first opening and a second opening, a first end of the supporting layer extends out of the casing through the first opening, and a second end of the supporting layer extends out of the casing through the second opening.

5. The flexible display device as claimed in claim 4, wherein a connection line between the first opening and the second opening coincides with a diameter of the casing.

6. The flexible display device as claimed in claim 4, wherein the flexible display device further comprises a first protective member and a second protective member, the first protective member is connected to the first end, the second protective member is connected to the second end, a dimension of the first protective member is greater than a dimension of the first opening, and a dimension of the second protective member is greater than a dimension of the second opening.

7. The flexible display device as claimed in claim 1, wherein the mark is disposed on the flexible display screen.

8. The flexible display device as claimed in claim 1, wherein the mark is disposed on the supporting layer.

9. The flexible display device as claimed in claim 1, wherein the display device further comprises an adhesive layer, the adhesive layer is disposed between the supporting layer and the flexible display screen, and the flexible display screen is fixed on the supporting layer by the adhesive layer.

10. The flexible display device as claimed in claim 9, wherein material of the adhesive layer is made of optical clear adhesive.

11. The flexible display device as claimed in claim 1, wherein a thickness of the supporting layer ranges from 20 to 30 microns.

12. The flexible display device as claimed in claim 1, wherein material of the supporting layer is made of stainless steel.

13. The flexible display device as claimed in claim 1, wherein an area of the flexible display screen is less than or equal to an area of the supporting layer.

14. The flexible display device as claimed in claim 1, wherein the first roller and the second roller are outer gears, the casing is an inner gear, and the outer gears engage the inner gear.

15. The flexible display device as claimed in claim 1, wherein the flexible display device further comprises a drive member, the drive member drives the roller assembly to rotate to retract the supporting layer back into the casing.

16. A terminal, comprising a flexible display device, and the flexible display device comprising:

a casing, the casing being cylindrical, an accommodating cavity defined in the casing, and an opening defined in a side surface of the casing;

a roller assembly disposed in the accommodating cavity, comprising a first roller, a second roller, and a connecting member connecting the first roller and the second roller, and axial lines of the first roller and the second roller parallel an axial line of the casing;

a supporting layer wrapped around the first roller and the second roller, a wrapping direction of the supporting layer on the first roller being counter to a wrapping direction of the supporting layer on the second roller, and the supporting layer extending out of the casing through the opening; and a flexible display screen disposed on the supporting layer, wherein a mark is disposed on the flexible display device, and the mark is configured to mark up a middle position of the supporting layer.

17. The terminal as claimed in claim 16, wherein a dimension of the first roller is equal to a dimension of the second roller.

18. The terminal as claimed in claim 16, wherein the flexible display device further comprises a protective member, the protective member is connected to an end of the supporting layer, and a dimension of the protective member is greater than a dimension of the opening.

19. The terminal as claimed in claim 16, wherein the opening comprises a first opening and a second opening, a first end of the supporting layer extends out of the casing through the first opening, and a second end of the supporting layer extends out of the casing through the second opening.

* * * * *